United States Patent
Okino

[19]

[11] Patent Number: 6,151,101
[45] Date of Patent: Nov. 21, 2000

[54] CHARGED-PARTICLE-BEAM PROJECTION-EXPOSURE APPARATUS AND METHODS EXHIBITING INCREASED THROUGHTPUT

[75] Inventor: Teruaki Okino, Kamakura, Japan

[73] Assignee: Nikon Corporation, Tokyo, Japan

[21] Appl. No.: 09/419,830

[22] Filed: Oct. 14, 1999

[30] Foreign Application Priority Data

Oct. 14, 1998 [JP] Japan .................................. 10-306395

[51] Int. Cl.$^7$ ............................. G03B 27/42; A61N 5/00; G21K 5/10
[52] U.S. Cl. .................... 355/53; 250/492.2; 250/492.22
[58] Field of Search .................................. 355/53, 67–71, 355/77; 250/492.2, 492.22, 492.23, 397, 398; 430/269, 296

[56] References Cited

U.S. PATENT DOCUMENTS

| | | | |
|---|---|---|---|
| 5,130,547 | 7/1992 | Sakamoto et al. | 250/492.2 |
| 5,404,019 | 4/1995 | Ohno et al. | 250/492.23 |
| 6,057,907 | 5/2000 | Satoh et al. | 355/53 |
| 6,069,684 | 5/2000 | Golladay et al. | 355/53 |

*Primary Examiner*—Russell Adams
*Assistant Examiner*—Hung Henry Nguyen
*Attorney, Agent, or Firm*—Klarquist Sparkman Campbell Leigh & Whinston, LLP

[57] ABSTRACT

Charged-particle-beam (CPB) methods and apparatus are disclosed that achieve efficient correction of imaging distortions or astigmatisms (e.g., shape astigmatism) arising from differences in feature distributions within individual exposure units of a divided reticle defining a pattern for use in divided-pattern projection-exposure CPB microlithography. Before exposure of the reticle, data concerning the feature distribution inside each exposure unit of the reticle are evaluated so as to produce a respective "index" datum for the exposure units. Corresponding to each datum is a profile of values of imaging parameters. These data are stored as a look-up table in a memory of a controller. The table is queried when an exposure unit of the reticle comes up for exposure. The index of the respective exposure unit provides a key to the respective values of the imaging parameters to be applied as the exposure unit is being exposed. As conditions dictate, the data in the table can be overridden. Also, the data can be interpolated or extrapolated to reduce the data processing burden accompanying the exposure of each exposure unit.

24 Claims, 5 Drawing Sheets

| RANK | AMOUNT OF CORRECTION | | | |
|---|---|---|---|---|
| | SHAPE ASTIGMATISM | IMAGING ASTIGMATISM | FOCUS | |
| 1 | | | | |
| 2 | | | | |
| ⋮ | | | | |
| n | | | | |

SUBFIELD SHAPE

FIG. 5(B)

IMAGE-SHAPE ASTIGMATISM

FIG. 5(C)

IMAGE MAGNIFICATION CHANGE

FIG. 5(D)

IMAGE ROTATION CHANGE

CHARGED-PARTICLE-BEAM PROJECTION-EXPOSURE APPARATUS AND METHODS EXHIBITING INCREASED THROUGHTPUT

FIELD OF THE INVENTION

This invention pertains to microlithography apparatus and methods as used, for example, in the manufacture of semiconductor integrated circuits and displays. More specifically, the invention pertains to such apparatus and methods that employ a charged particle beam (e.g., electron beam or ion beam) as an energy beam for performing projection-transfer of a pattern, defined by a segmented reticle, onto a sensitive substrate such as a semiconductor wafer. Yet more specifically, the invention pertains to such apparatus and methods that include correction of any of various imaging parameters arising from differences in the feature distribution within pattern portions.

BACKGROUND OF THE INVENTION

The known prior art is summarized below in the context of electron-beam microlithographic systems. Whereas electron-beam microlithography potentially is a highly accurate method for performing pattern transfer, conventional experience with this technique has been plagued by, among various problems, low "throughput" (number of wafers that can be exposed per unit time).

Various approaches (termed "partial-pattern transfer" techniques) have been investigated to increase throughput. Examples include "cell projection," "character projection," and "block exposure." In these approaches, the entire pattern is not exposed in one shot. Rather, multiple shots are used to expose the entire pattern and only a portion of the pattern is exposed in each shot. For example, cell projection is especially used whenever the pattern comprises a small basic unit portion (measuring, e.g., $(5 \mu m)^2$ on the wafer) that is repeated a large number of times in the pattern, such as a pattern for a memory chip in which the unit portion is a single memory cell. An image of a single unit portion is transferred to the wafer per shot; hence, many shots are required to transfer all the unit portions in the pattern. The same unit portion can be defined in multiple regions on the reticle. Unfortunately, circuit patterns such as memory chips include portions that are not repeated, and transfer of such portions requires application of another technique such as "variable-shaped beam" lithographic writing. The need to use multiple techniques to achieve transfer of the entire pattern reduces throughput.

Another approach (termed "full-field transfer"), in which a reticle defining an entire pattern is transferred in one shot to a corresponding die on the wafer, offers prospects of very high throughput. Unfortunately, however, the very large exposure field required necessitates using electron optics having a correspondingly extremely large field. Such large electron-optical systems are prohibitively costly and bulky. Also, in such large fields, the peripheral regions of the field as projected tend to exhibit large aberrations that have been impossible to date to adequately correct. Furthermore, a reticle for use with full-field exposure is extremely difficult to fabricate.

In another approach (termed "divided-pattern projection-exposure"), a reticle defines an entire pattern to be transferred to a corresponding die on the wafer, but the pattern field as defined on the reticle is divided into multiple "exposure units" (e.g., "subfields") that are individually and sequentially illuminated. Illumination is performed by an "illumination beam" passing through an "illumination-optical system" located upstream of the reticle. An image of the illuminated exposure unit passes (as a "patterned beam") through a "projection-optical system" located between the reticle and the wafer. The projectionoptical system has a field that is much smaller than the field of the entire pattern as defined on the reticle. The image that is projected by the projection-optical system onto a corresponding region of the wafer is "demagnified" or "reduced," by which is meant that the image is smaller (usually by an integer "demagnification ratio" such as ¼ or ⅕) than the corresponding exposure unit on the reticle. Systems that perform divided-pattern projection-exposure achieve lower throughput than the full-field exposure technique but substantially higher throughput than partial-pattern techniques such as the cell projection technique.

Among the techniques summarized above, the divided-pattern projection-exposure technique has received the greatest recent attention. In divided-pattern projection-exposure, as each exposure unit is illuminated for exposure, certain dynamic imaging corrections can be made, such as correcting image focus and certain aberrations, as the image of the exposure unit is exposed on the wafer. The images are formed on the wafer surface in respective locations, selected by appropriate movements of the reticle stage and wafer stage as well as by beam deflection, that serve to "stitch" together the complete pattern on the exposed surface. Thus, exposure across an optically wide field is accomplished with better resolution and accuracy than obtained with full-field exposure.

Incidentally, in any conventional charged-particle-beam (CPB) microlithography system, whenever the current of the beam used to form the image is high, many interactions occur between individual charged particles of the beam. Such interactions, termed the "Coulomb effect," can adversely affect the quality of the image. In divided-pattern projection-exposure, undesirable Coulomb-effect changes also can be evident from one exposure unit to the next depending on differences in feature distribution and/or feature density from one exposure unit to the next. Conventional CPB microlithography systems can perform correction of some of these effects using optical-correction functions of the CPB optical system. (the "CPB optical system" is the illumination-optical system together with the projection-optical system.) For example, in a variable-shaped beam microlithography system, correction of focus of an image can be estimated from the transverse area of the shaped beam and other parameters such as acceleration voltage, current density of the beam, beam-aperture angle, and axial length of the CPB optical system.

With a conventional divided-pattern projection-exposure system, the dimensions of a single exposure unit on the reticle are $(100 \mu m)^2$ to $(1,000 \mu m)^2$. Conventional wisdom holds that, in the absence of other contributing factors, the Coulomb effect is insubstantial with such beam dimensions. (See, Berger et al., "Particle-Particle Interaction in Image Projection Lithography, *J. Vac. Sci. Technol.* B11(6):2294, November/December 1993.) This is considered to be a substantial advantage with divided-pattern projection-exposure systems because it theoretically allows beam current to be increased to obtain higher throughput without imparting excessive adverse changes to the images formed on the wafer. However, most if not all patterns that can be transferred using divided-pattern projection-exposure are not uniform. I.e., the pattern typically has a non-uniform distribution of features; even individual exposure units typically have pattern-feature distributions that are not uniform. A nonuniform distribution of features in an exposure unit will result in corresponding localized variations in the current density of the patterned beam as projected onto the wafer. The resulting corresponding variations in localized Coulomb effects can cause significant variations, over each such exposure unit, of imaging characteristics such as shape astigmatism and imaging astigmatism, as well as focus, rotation, magnification, and position of the image of the exposure unit on the wafer.

Figure 5A:
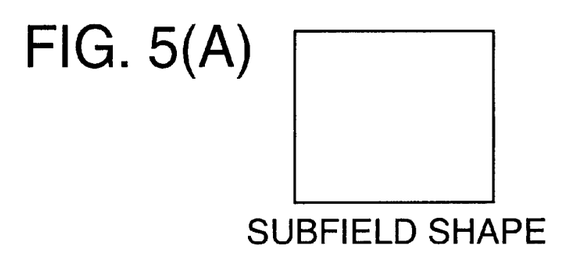
FIG. 5(A) shows an ideally shaped exposure unit and FIGS. 5(B)–5(D) show various respective imaging aberrations of the exposure unit, as correctable according to the invention.
Figure 5B:
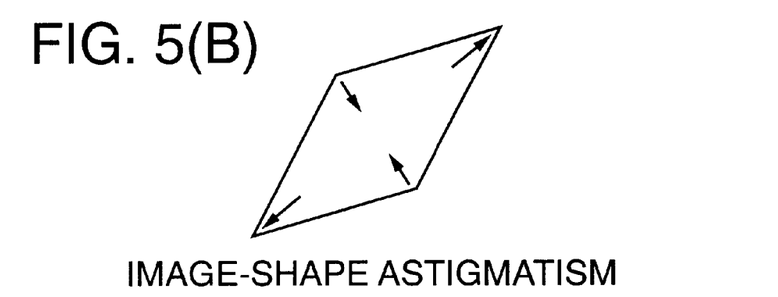
Figure 5C:
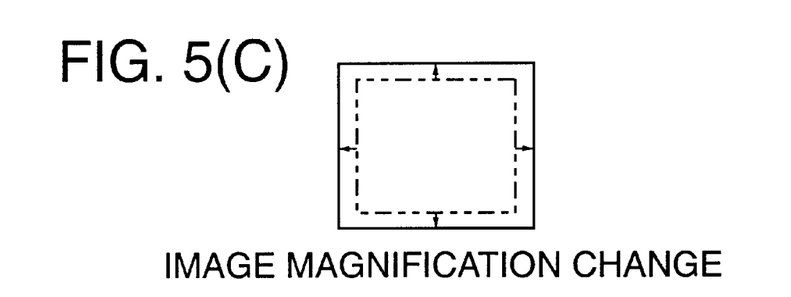
Figure 5D:
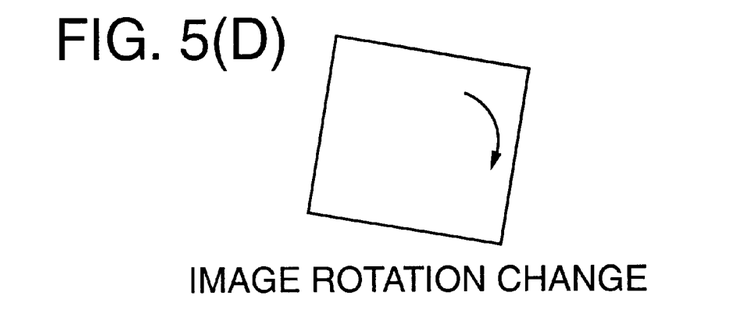

By way of example, FIG. 5(A) shows an ideally shaped image of a rectangular exposure unit, and FIGS. 5(B)–5(D) depict (in exaggerated form) respective changes in the image arising from various respective aberrations. Image-shape astigmatism changes the magnification of the image depending on the orientation, as shown in FIG. 5(B), transforming the ideal rectangular image into a parallelogram. A magnification change alters the dimensions of the image regardless of the orientation, as shown in FIG. 5(C). Rotation causes the image to be rotationally displaced about the optical axis, as shown in FIG. 5(D).

Certain of these faults can be corrected by appropriate dynamic corrections of the operational parameters of the projection-optical system. The respective magnitudes of such corrections are determined based on data concerning the reticle pattern and on data concerning various structural and/or configurational parameters of the CPB optical system. However, incorporating the respective magnitudes of correction, based on such data, with other data concerning the projection-exposure apparatus itself is impractical due to the large quantity of data that must be processed before each shot. For example, if: (1) the area of an exposure unit is $(250\ \mu m)^2$, (2) the exposure unit is divided into 16 subregions (arranged in a 4×4 matrix), and (3) the distribution of features in a subregion is represented by two different parameters, then there would be $2^{16}$ correction data to be calculated per exposure unit before making an exposure of the exposure unit. If corrections are made to each of shape astigmatism, imaging astigmatism, focus, rotation, magnification, and image position, then the quantity of data to be processed is further multiplied by six. In addition, correction would have to be changed whenever general apparatus parameters such as current density or beam aperture angle were changed, thereby further multiplying the quantity of data that would need to be processed.

SUMMARY OF THE INVENTION

The present invention addresses the problems summarized above. An object of the invention is to provide charged-particle-beam (CPB) projection-exposure apparatus and methods that efficiently execute various corrections of imaging parameters (such as shape astigmatism) that arise from differences in feature distributions within the various exposure units of a segmented reticle used for divided-pattern projection-exposure. It is a further object to provide such methods and apparatus that achieve high-resolution pattern transfer with high accuracy.

According to a first aspect of the invention, CPB microlithographic projection-exposure apparatus are provided. A representative embodiment of such an apparatus comprises a substrate stage, a reticle stage, an illumination-optical system, a projection-optical system, and a controller. The substrate stage is configured to hold a sensitive substrate mounted thereon for performing CPB projection-exposure of the substrate. The reticle stage is configured to hold a reticle mounted thereon, the reticle defining a pattern to be CPB projection-exposed onto the substrate and being divided into multiple exposure units each defining a respective portion of the pattern. The illumination-optical system is situated upstream of the reticle stage and comprises multiple CPB1 illumination-optical components. The illumination-optical system is configured to sequentially illuminate the exposure units of the reticle with a CPB illumination beam. The projection-optical system is situated between the reticle stage and the substrate stage, and comprises multiple CPB-projection-optical components. The projection-optical system is configured to project, via a patterned beam propagating downstream of the reticle, an image of the illuminated exposure unit onto a corresponding location on the sensitive substrate so as to stitch together the exposure-unit images and form an image of the pattern on the substrate. The controller is connected to each of the illumination-optical components and to each of the projection-optical components. The controller is configured to controllably energize each of the components, and comprises a memory for storing a look-up table comprising a listing of index (rank) data for each of multiple exposure units of the pattern. The look-up table also stores, for each index datum, corresponding values of imaging parameters pertaining to the components. Each index datum is based on a distribution of pattern features within the respective exposure unit. As an exposure unit is selected for exposure, the controller recalls from the memory the index datum for the exposure unit as well as the corresponding values of imaging parameters, and causes energization of the components according to the recalled values of the imaging parameters. Thus, an optical correction is performed of the image of the respective exposure unit as formed on the substrate.

The controller is desirably configured to prepare and store the lookup table for a particular divided reticle before the reticle is used for performing projection exposure. For example, the look-up table can be prepared from pattern data produced in advance such as when the reticle was designed or fabricated.

The imaging parameters desirably pertain to at least one of shape astigmatism, imaging astigmatism, focus, rotation, magnification, and position of the image of the exposure unit on the reticle. Respective values of these parameters can be determined according to optical simulation calculations or actual measurements as standards. The respective values of the imaging parameters also can be determined with a consideration of general projection-exposure-apparatus variables including one or more of beam-acceleration voltage, beam-current density, beam-aperture angle, and CPB optical-system axial length.

According to another aspect of the invention, methods are provided for performing CPB microlithographic projection-exposure. A representative embodiment includes the steps of defining a pattern, to be projection-exposed onto a sensitive substrate, on a divided reticle comprising multiple exposure units each defining a respective portion of the pattern. The exposure units are sequentially illuminated with a CPB illumination beam to form a respective CPB patterned beam. The patterned beam is projected onto a sensitive substrate to form images of the exposure units at respective locations on the substrate at which the images of the exposure units are stitched together to form an image of the pattern on the substrate. The method is especially directed to performing an imaging correction of an image of an exposure unit as formed on the substrate. To such end, an index datum (correction rank) is provided for each of various exposure units of the reticle based on respective distributions of pattern features in the exposure units. Respective values of at least one imaging parameter for imaging the exposure units on the substrate are provided, wherein the values correspond to the respective index data and are appropriate for correcting an image of the respective exposure units as formed on the substrate. For each of various exposure units of the pattern, the index data and respective values of the imaging parameter(s) are stored as a look-up table in a memory. As individual exposure units are selected for exposure, the respective index datum and respective values of the imaging parameters are recalled from the look-up table in the memory. The selected exposure unit is exposed according to the respective imaging parameters.

By consulting the look-up table, rather than performing extensive calculations based on voluminous data, before each exposure, exposure efficiency (and hence throughput) is substantially improved. I.e., substantially less time is required to obtain, using the index for a particular exposure unit, respective values of imaging parameters from the look-up table than required to calculate such values before making the respective exposure.

It is possible to override the values listed in the table as required in response to, for example, changes in beam-current density, beam aperture angle, etc. Also, it is unnecessary to store image-correction values corresponding to each and every correction rank. Rather, respective values for certain ranks can be determined as required by interpolation or extrapolation of data in the table for other ranks.

Shape astigmatism can be corrected using, for example, an astigmatism corrector disposed between the reticle and the wafer near the reticle or wafer surface, respectively. Imaging astigmatism can be corrected using an astigmatism corrector disposed at a location near the principal plane of a projection lens. Focus, rotation, and magnification can be corrected using an appropriate combination of fields produced by three hollow-core coils, respectively, disposed between the reticle and the wafer. Image position can be corrected using one or more deflectors disposed between the reticle and the wafer.

The foregoing and additional features and advantages of the invention will be more readily apparent from the following detailed description, which proceeds with reference to the accompanying drawings.

BRIEF DESCRIPTION OF THE DRAWINGS

FIG. 1 is an elevational schematic diagram of key components in a charged-particle-beam (specifically, electron-beam) microlithography projection-exposure apparatus according to a representative embodiment of the invention. FIG. 1 shows components of the illumination-optical system, the projection-optical system, and the control system.

DETAILED DESCRIPTION

Figure 1:
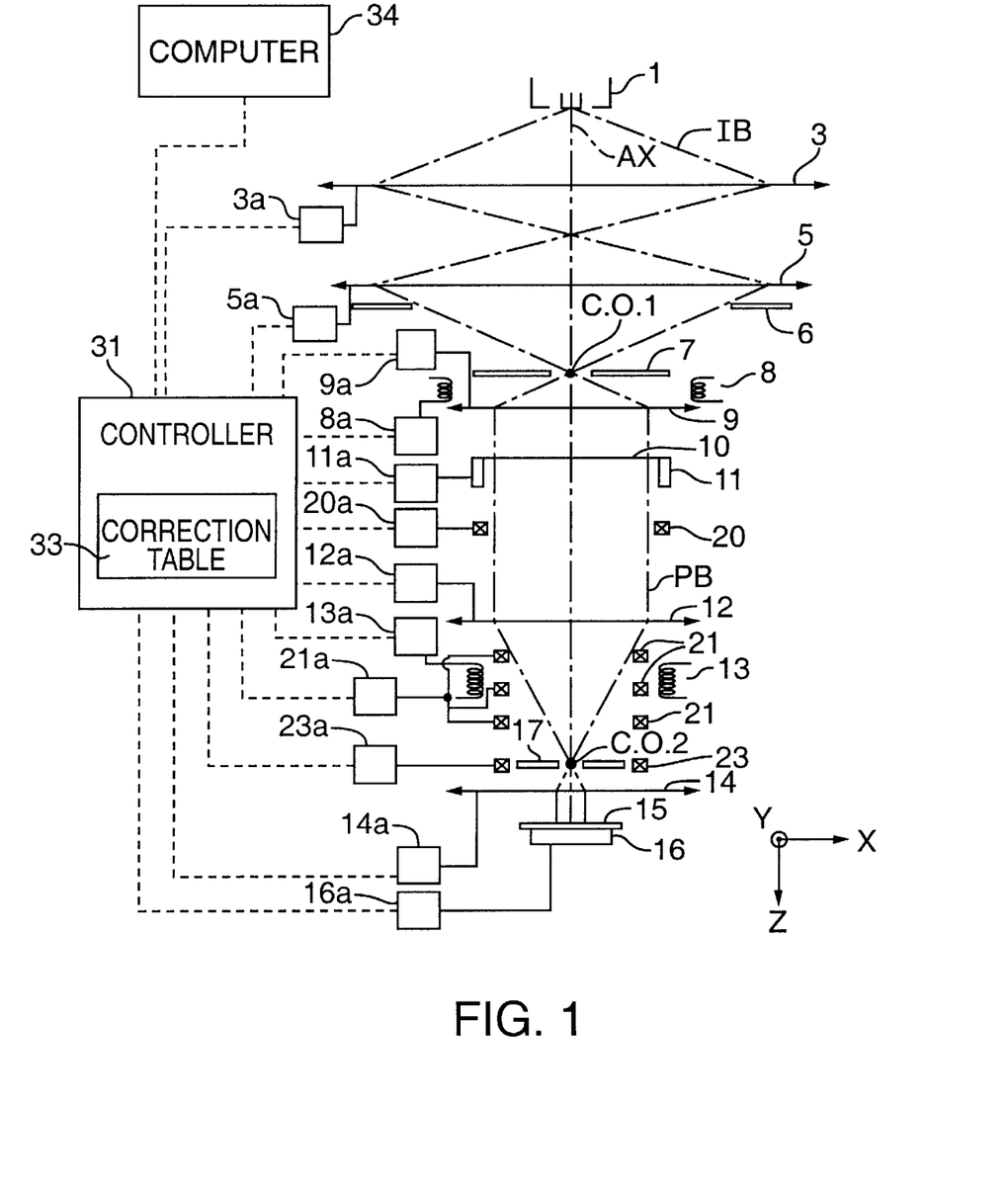

Various components and certain imaging relationships of a charged-particle-beam (CPB) microlithographic projection-exposure apparatus according to a representative embodiment of the invention are illustrated in FIG. 1. As a representative example of a CPB apparatus, the apparatus of FIG. 1 utilizes an electron beam. FIG. 1 also schematically depicts a control system for controlling the overall optical system of the apparatus.

An electron gun 1 is situated at the most upstream end of the apparatus (top of FIG. 1). The electron gun 1 emits an electron beam in a downstream direction along an optical axis AX. FIG. 1 also includes a reticle 10 and a substrate (termed herein a "wafer") 15. The beam propagating between the electron gun 1 and the reticle 10 is termed an "illumination beam" IB and the beam propagating between the reticle 10 and the wafer 15 is termed a "patterned beam" PB. From the electron gun 1, the illumination beam IB passes through a first condenser lens 3 and a second condenser lens 5 situated downstream of the electron gun 1. The condenser lenses 3, 5 cause the illumination beam IB to form a first crossover image C.O.1 on the optical axis AX downstream of the second condenser lens 5.

Downstream of the second condenser lens 5 is a "beam-shaping aperture" 6 that defines an opening (typically rectangular or square in profile) that trims the illumination beam IB to have a transverse size and profile to illuminate a single exposure unit (e.g., subfield) on the reticle 10. For example, the beam-shaping aperture 6 shapes the illumination beam to have a transverse square profile with dimensions of just over $(1 \text{ mm})^2$ on the reticle 10. An image of the beam-shaping aperture 6 is formed on the reticle 10 by a third condenser lens 9 situated between the first crossover C.O.1 and the reticle 10.

A blanking aperture 7 is axially disposed at the position of the first crossover C.O.1 downstream of the beam-shaping aperture 6. An illumination-beam deflector (IB deflector) 8 is also disposed downstream of the beam-shaping aperture 6. The IB deflector 8 scans the illumination beam IB in the X direction in FIG. 1, so as to illuminate each of multiple exposure units within the scanning range of the deflector 8 and within the field of the illumination-optical system. (The "illumination-optical system" comprises the components discussed above that are situated between the electron gun 1 and the reticle 10.) The third condenser lens 9 collimates the illumination beam IB and forms an image of the beam-shaping aperture 6 on a region (exposure unit) on the reticle 10 illuminated by the illumination beam IB.

Even though only one exposure unit (situated on the axis AX) is shown in FIG. 1, it will be understood that the reticle 10 actually extends within the X-Y plane perpendicular to the optical axis AX. The reticle 10 defines an entire pattern to be projection-exposed onto the wafer 15 at each of multiple dies (chips) on the wafer 15. As suggested above, the reticle is divided into multiple (typically thousands) of "exposure units" (also termed "subfields") that define respective portions of the overall pattern. The illumination beam is deflected by the IB deflector 8 as required to illuminate individual exposure units in a sequential manner within the field of the illumination-optical system.

Situated between the reticle 10 and the wafer 15 is a "projection-optical system" comprising a first projection lens 12, a second projection lens 14, and at least one deflector 13. Whenever the illumination beam IB strikes an exposure unit on the reticle 10, particles of the beam pass through the illuminated exposure unit and become the "patterned beam" PB. The patterned beam PB is demagnified (also termed "reduced") by the projection lenses 12, 14 and deflected by the deflector 13 to form an image of the illuminated exposure unit at a desired location on the wafer 15.

A second crossover C.O.2 is formed at an axial location at which the distance between the reticle 10 and the wafer 15 is subdivided by the "demagnification ratio" of the projection-optical system. (As used herein, the demagnification ratio is the integer ratio factor by which an image as formed on the wafer 15 is smaller than the corresponding exposure unit on the reticle 10.) A contrast aperture 17 is disposed at the second crossover C.O.2. The contrast aperture 17 blocks charged particles in the patterned beam PB that were scattered as the illumination beam IB passed through the reticle 10. Thus, such scattered particles do not reach the wafer 15.

The combination of the illumination-optical system and the projection-optical system is termed herein the "electron-optical system" (or more generally "CPB-optical system" if the beam is other than an electron beam).

The reticle 10 is mounted on a reticle stage 11 that can be moved as required in the X and Y directions. The wafer (substrate) 15 is mounted on a wafer stage 16 that also can move as required in the X and Y directions. The reticle stage 11 and wafer stage 16 are scanningly moved in a synchronous manner in Y directions that are opposite each another. The wafer 15 is also termed a "sensitive substrate" because the upstream-facing surface of the wafer is typically coated with a layer of a substance (termed a "resist") that is imprintable with the projected images.

Each of the stages 11, 16 is provided with a respective position-measurement system (not shown) employing laser interferometers. Thus, the positions of the respective stages 11, 16 can be determined and controlled extremely accurately. Such positional control of the stages 11, 16, along with other features of the FIG. 1 embodiment, allows the images of the exposure units on the reticle 10 to be accurately "stitched" together on the wafer 15 as the images are exposed onto the wafer.

The FIG. 1 embodiment also includes components that serve to impart "corrections" to the electron-optical system as required for producing acceptable images of projected exposure units. Such components include a "shape-astigmatism" corrector 20 disposed immediately downstream of the reticle 10 and an "imaging-astigmatism" corrector 23 disposed at the same axial position as the contrast aperture 17. Each of these correctors 20, 23 can be configured as a conventional astigmatism-correcting coil called a "stigmator." A three-stage hollow-core coil 21 is disposed between the first projection lens 12 and the contrast aperture 17. Each stage of the hollow-core coil 21 applies a respective lens action to the patterned beam PB to impart corrections for focus, magnification, and rotation of the image, respectively. These three image parameters can be suitably corrected by appropriately selecting the magnitude and direction of electrical activation energy applied to the respective stages of the hollow-core coil 21.

Figure 3:
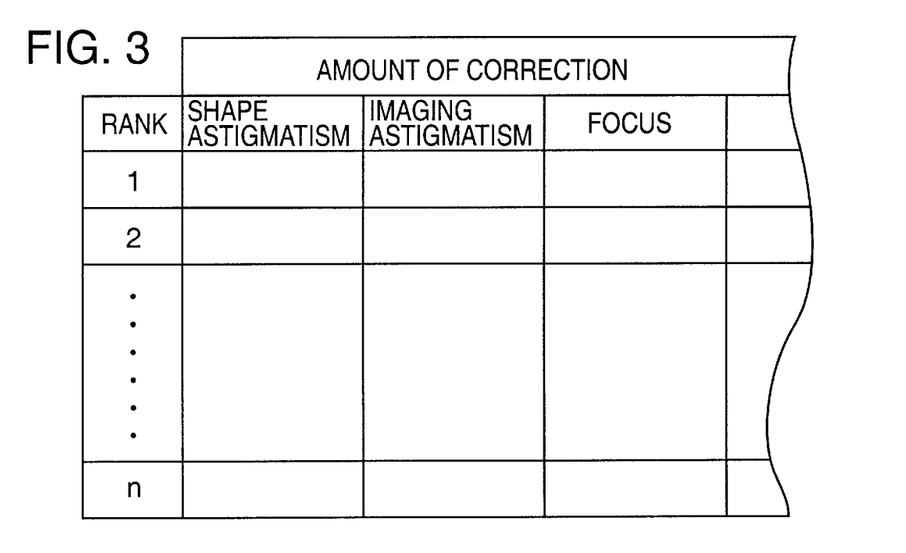
FIG. 3 is a representative correction (look-up) table as stored in and used by the controller 31 of the FIG. 1 embodiment while making exposures.

The FIG. 1 embodiment also includes a controller 31 including a memory in which a correction table 33 can be stored in advance of need for use in performing corrections according to the invention. A representative correction ("look-up") table is shown in FIG. 3. According to the correction table, correction amounts for shape astigmatism, imaging astigmatism, focus, etc. (other imaging parameters are listed in additional columns, not shown, arrayed to the right of the three columns shown), are determined according to their respective correction index or correction rank (1, 2, 3, . . . , n). These correction amounts are determined using data derived from optical-simulation calculations or other calculations using the results of simulations, or from actual measurements. In determining appropriate corrections to be imparted to the image of each respective exposure unit, the controller 31 can also factor in certain general apparatus data including beam-acceleration voltage, beam-current density, beam aperture angle, optical-system axial length, etc.).

Optical-simulation calculations can be performed using any of various commercially available system-simulation software packages such as available from Munro's Electron Beam Software, Ltd. (England). The simulations can be achieved using any of various apparatus data.

Figure 4:
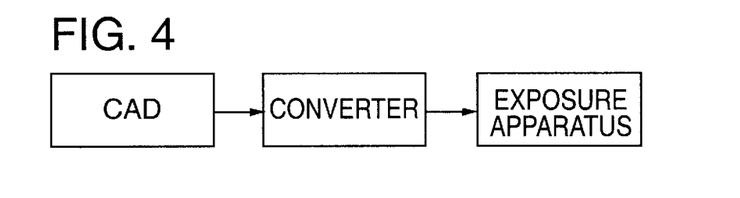
FIG. 4 is a block diagram of a sequence of steps for providing the respective correction indices (correction ranks) and corresponding values of image-correction parameters for the exposure units of a reticle defining a particular pattern, stored as data in the look-up table.

A procedure for determining a "correction index," based on the feature distribution in a particular illuminated exposure unit, is described with reference to FIG. 4. First, the device pattern to be defined by the reticle 10 is configured using a design system utilizing computer-aided design (CAD). The CAD data are converted, using data-conversion software, into a data format compatible with the reticle writer and with exposure data used by the projection-exposure apparatus. At the same time, data pertaining to the distribution of features in each exposure unit of the pattern are produced and stored, and the optimum correction index (rank) for each individual exposure unit is calculated. These exposure data are then stored in the memory of the controller 31 of the exposure apparatus for recall as required during exposure of the exposure units of the reticle. The data are stored in the look-up table (FIG. 3), in which each listed correction rank has an associated profile of corrections to be made to imaging parameters listed in the look-up table. The respective correction amounts for each and every rank do not have to be stored in the look-up table. Rather, some such data can be obtained as needed by interpolation or extrapolation of data in the table.

As each exposure unit comes up for exposure, the controller 31 reads the image-correction data corresponding to the respective correction index ("rank") assigned to the respective exposure unit. The data are read from the memory. The respective correction amounts to be applied to each imaging parameter listed in the look-up table 33 for the respective rank are read from the look-up table.

Correction of an image is performed by routing control signals from the controller 31 to respective coil power supplies for the various correctors and lenses. More specifically, each of the lenses 3, 5, 9, 12, 14 and deflectors 8, 13 discussed above is controlled by the controller 31 via a respective coil power supply 3a, 5a, 9a, 12a, 14a, and 8a, 13a. In addition, each of the various correctors 20, 21, 23 is also controlled by the controller 31 via a respective coil power supply 20a, 21a, 23a. Furthermore, movements of the reticle stage 11 and wafer stage 16 are controlled by the controller 31 via respective stage-driver controllers 11a, 16a. As the exposure units on the reticle 10 are sequentially illuminated, the respective image of each exposure unit is subjected to various corrections according to the recalled data associated with the respective correction rank for the exposure unit and projected to a desired location on the wafer 15. In such a manner, the reduced (demagnified) images of the exposure units are accurately stitched together on the wafer 15 to achieve transfer of the complete reticle pattern onto the wafer 15.

Figure 2:
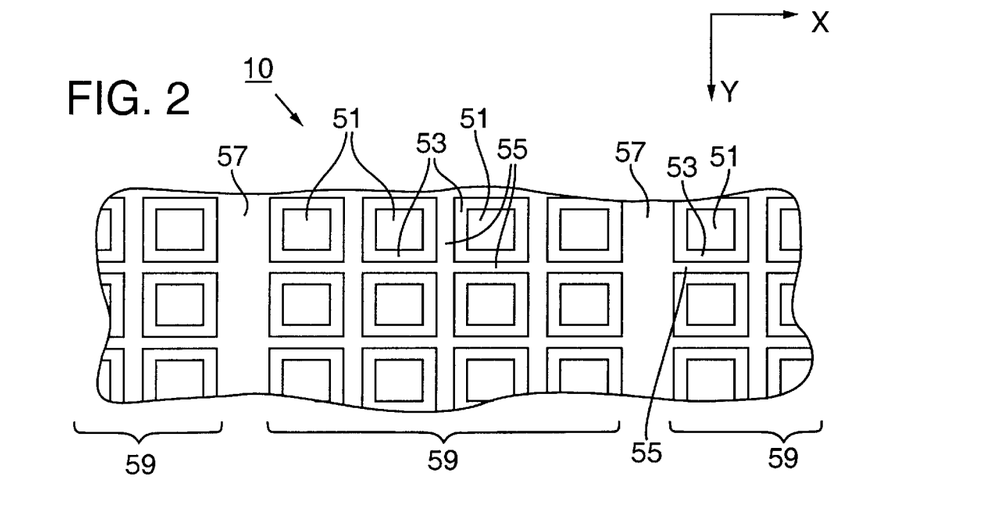
FIG. 2 is a plan view schematically depicting various structural aspects of a representative reticle as used with the FIG. 1 embodiment.

An example of a reticle used to perform divided-pattern projection-transfer according to the invention using an electron beam is shown in FIG. 2. Strong contrast is imparted to the image as formed on the wafer by providing on the reticle 10 corresponding regions defined by an electron-scattering material exhibiting a large scattering angle, and other regions defined by an electron-scattering material exhibiting a relatively small scattering angle. Thus, only electrons having a small scattering angle are allowed to pass through the contrast aperture 17 to form an image on the wafer 15. (The contrast aperture 17 in FIG. 1 is disposed at the pupil plane of the projection-optical system.) Two main types of reticles 10 can be used. A first type, termed a "scattering-membrane" reticle, comprises a thin silicon membrane (e.g., approximately 0.1 pm thick), upon which regions of a scattering material (e.g., heavy metal) are deposited to define pattern features. A second type, termed a "scattering-stencil" reticle, comprises a relatively thick (e.g., approximately 2 $\mu$m thick) silicon membrane that defines voids (through holes) corresponding to pattern features. In the scattering-membrane reticle, the silicon membrane is a low-scattering-angle electron-scattering material, whereas, in the scattering-stencil reticle, the silicon membrane is a high-scattering-angle electron-scattering material.

In FIG. 2, regions denoted by the squares 51 correspond to single exposure units (subfields) each measuring approximately (0.5 mm)$^2$ to (5 mm)$^2$ at the reticle. The peripheral area 53 surrounding each exposure unit 51 is termed a "skirt." The skirt 53 is made from a scattering material exhibiting a relatively high scattering angle so as to trim the patterned beam PB propagating downstream of the respective exposure unit 51. The width of each skirt 53 is approximately 10 to 100 $\mu$m. A strut member 55 extends perpendicularly (in the Z direction) from each skirt 53. Each strut 55 extends approximately 0.5 to 1 mm in the Z direction and approximately 100 $\mu$m in the X or Y direction; thus, the struts collectively provide the reticle with substantial rigidity and mechanical strength.

In FIG. 2, four exposure units 51 form a single linear group arrayed in a respective row in the X-direction on the reticle 10. (Actual reticles typically have more than four exposure units 51 per row. The number of exposure units in each such row is defined by the maximal scan width of the illumination beam IB in the X direction that can be achieved within the field of the illumination-optical and projection-optical systems.) Multiple such rows are arrayed in the Y direction to form a "stripe" 59. The reticle 10 typically comprises multiple stripes 59 arrayed in the X direction. Unusually wide struts 57 extend in the Y direction between adjacent stripes 59. The wide struts 57 provide additional rigidity to the reticle to further reduce flexing of the reticle. The wide struts 57 are typically several mm wide in the X direction. The width of each stripe 59 corresponds to the maximal deflection of the illumination beam IB that can be achieved within the field of the illumination-optical and projection-optical systems.

During projection-transfer exposure, the features defined in the various exposure units are stitched together on the wafer 15 without projection of the non-patterned areas such as the skirts 53 and struts. With a typical demagnification ratio of ¼ or ⅕, if a single chip (e.g., for a 4-gigabit DRAM) on the wafer measures 27 mm×44 mm, then the corresponding pattern defined on the reticle (including the non-patterned regions) is approximately (120 mm to 150 mm)× (230 mm to 350 mm).

Therefore, according to the present invention, values of various image-correction parameters for each exposure unit can be efficiently provided as required as each exposure unit comes up for exposure. To such end, a correction index (rank) is determined from data concerning the feature distribution inside each exposure unit. Respective values for each image-correction parameter corresponding to the respective correction indices are stored as a look-up table in a memory in the projection-exposure apparatus. As each exposure unit is selected for exposure, the respective index is read from the table, along with the respective values for the image-correction parameters. Thus, no extensive calculations are required before each exposure unit is exposed. The recalled values of image-correction parameters are applied by the controller 31 to respective components in the illumination-optical and projection-optical systems. The image-correction values as listed in the look-up table can be overridden as required to accommodate changes in, e.g., beam-current density, beam aperture angle, etc. The quantity of data to be processed per exposure unit is also substantially reduced because values of image-correction parameters can be derived by interpolation or extrapolation as required. Interpolation and extrapolation eliminate the need to store values of image-correction parameters corresponding to all ranks.

In the foregoing description, the controller 31 converts the index data into imaging parameters. However, in an alternative configuration (see FIG. 1), a computer 34 can be connected to the controller 31 for use in converting the index data to imaging parameters and routing the converted data to the controller as exposure data.

Therefore, CPB exposure methods and apparatus are provided that efficiently correct imaging conditions, such as shape astigmatism, arising from differences in the feature distributions within various exposure units of the reticle pattern. Such efficiency permits high-resolution and high-accuracy pattern transfer and exposure using so-called divided-pattern projection-transfer exposure apparatus and methods.

Figure 6:
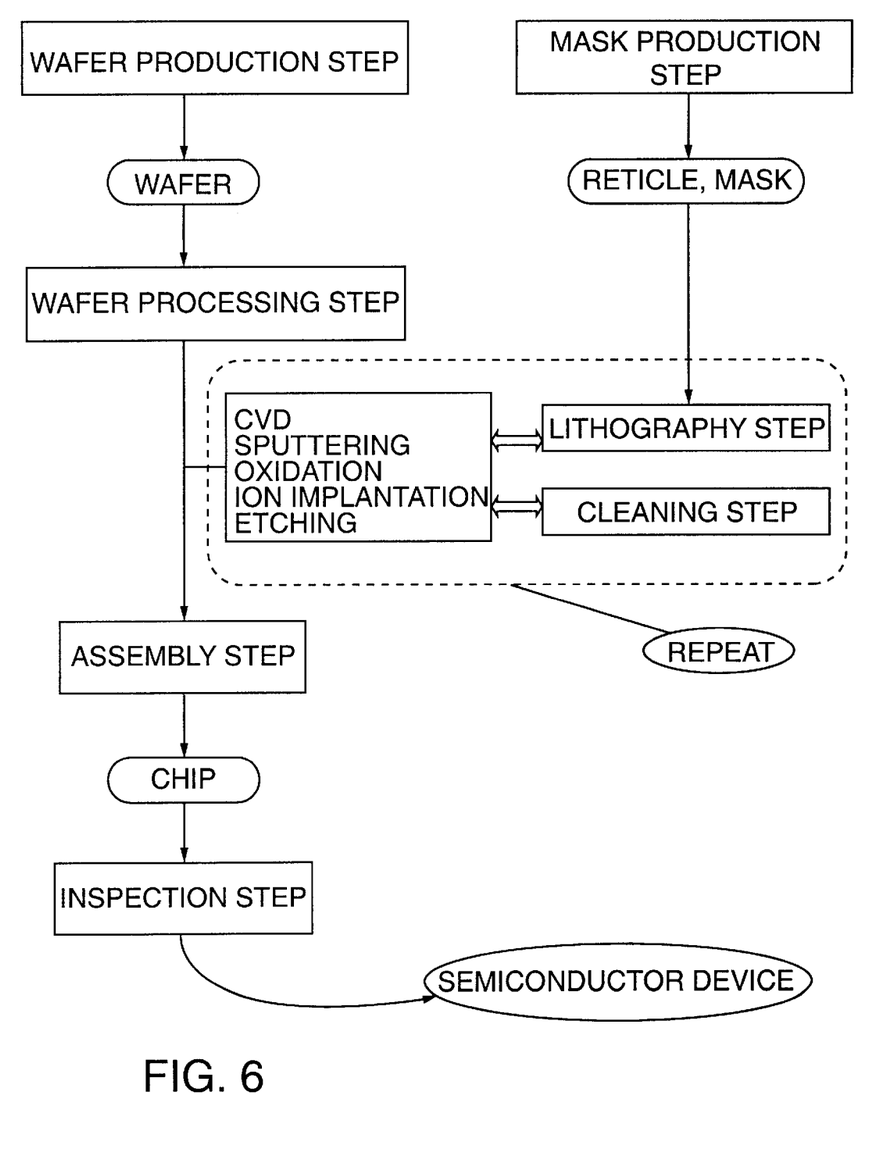
FIG. 6 is a process flowchart for manufacturing a semiconductor device, wherein the process includes a microlithography method according to the invention.

FIG. 6 is a flowchart of an exemplary semiconductor fabrication method to which apparatus and methods according to the invention can be readily applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 7:
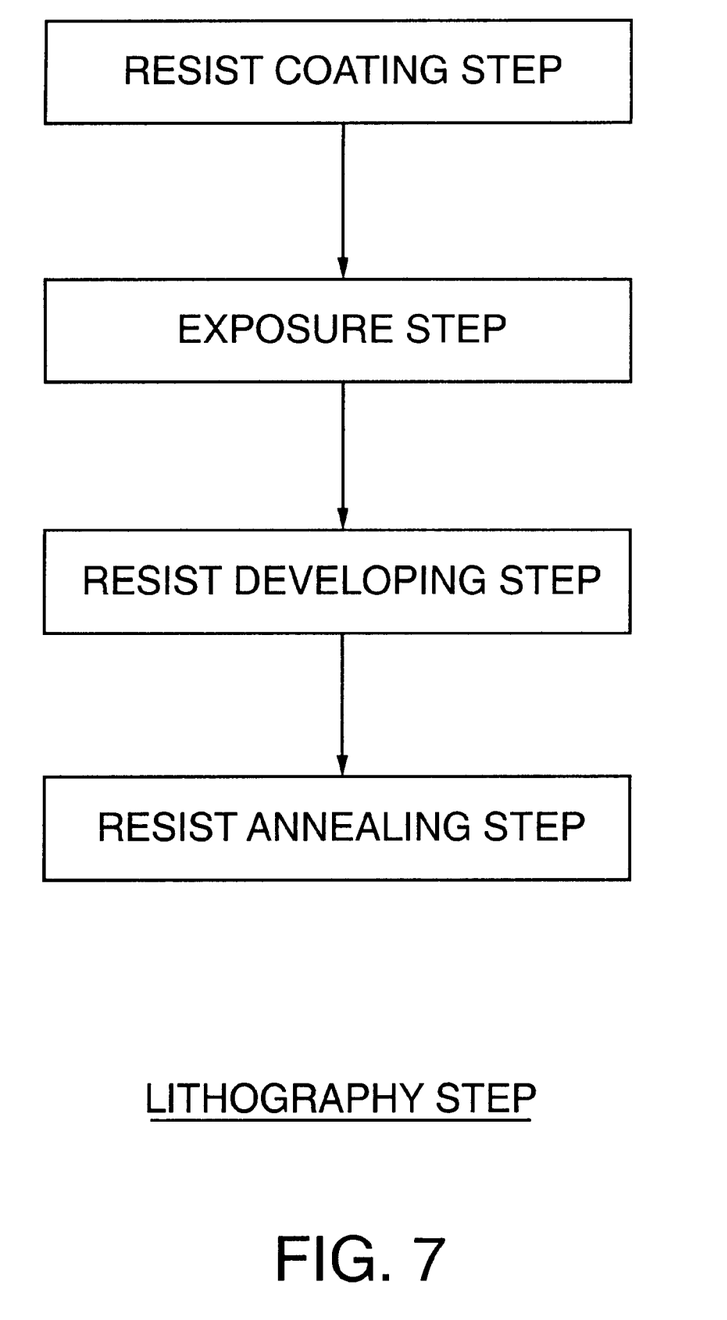
FIG. 7 is a process flowchart for performing a microlithography method that includes a projection-exposure method according to the invention.

FIG. 7 provides a flow chart of typical steps performed in microlithography, which is a principal step in wafer processing. The microlithography step typically includes: (1)

resist-coating step, wherein a suitable resist is coated on the wafer substrate (which can include a circuit element formed in a previous wafer-processing step; (2) exposure step, to expose the resist with the desired pattern; (3) development step, to develop the exposed resist; and (4) annealing step, to enhance the durability of the resist pattern.

Methods and apparatus according to the invention can be applied to a semiconductor fabrication process, as summarized above, to provide substantially improved accuracy and resolution of pattern transfer.

Whereas the invention has been described in connection with a representative embodiment, it will be understood that the invention is not limited to that embodiment. On the contrary, the invention is intended to encompass all modifications, alternatives, and equivalents as may be included within the spirit and scope of the appended claims.

What is claimed is:

1. A charged-particle-beam (CPB) microlithographic projection-exposure apparatus, comprising:
   (a) a substrate stage on which a sensitive substrate is mounted for CPB projection-exposure of the substrate;
   (b) a reticle stage on which a reticle is mounted, the reticle defining a pattern to be CPB projection-exposed onto the substrate and being divided into multiple exposure units each defining a respective portion of the pattern;
   (c) an illumination-optical system situated upstream of the reticle stage, the illumination-optical system comprising multiple CPBillumination-optical components and being configured to sequentially illuminate the exposure units of the reticle with a CPB illumination beam;
   (d) a projection-optical system situated between the reticle stage and the substrate stage, the projection-optical system comprising multiple CPB-projection-optical components and being configured to project, via a patterned beam propagating downstream of the reticle on the reticle stage, an image of the illuminated exposure unit onto a corresponding location on the sensitive substrate so as to stitch together the exposure-unit images and form an image of the pattern on the substrate; and
   (e) a controller connected to each of the illumination-optical components and to each of the projection-optical components, the controller being configured to controllably energize each of said components, the controller comprising a memory for storing a look-up table comprising a listing of index data for each of multiple exposure units of the pattern and, for each index datum, corresponding values of imaging parameters pertaining to said components, each index datum being based on a distribution of pattern features within the respective exposure unit, wherein, as an exposure unit is selected for exposure, the controller recalls from the memory the index datum for the exposure unit as well as the corresponding values of imaging parameters, and causes energization of said components according to the recalled values of imaging parameters to perform an optical correction of the image of the respective exposure unit as formed on the substrate.

2. The apparatus of claim 1, wherein the controller is configured to prepare and store the look-up table for a particular divided reticle before the reticle is used for performing projection exposure, the look-up table being prepared from pattern data available in advance of exposing the reticle.

3. The apparatus of claim 1, wherein the imaging parameters pertain to at least one of shape astigmatism, imaging astigmatism, focus, rotation, magnification, and position of the image of the exposure unit on the reticle.

4. The apparatus of claim 1, wherein the respective values of the imaging parameters are determined according to optical simulation calculations or actual measurements as standards.

5. The apparatus of claim 4, wherein the respective values of the imaging parameters are determined further according to projection-exposure apparatus variables including one or more of beam-acceleration voltage, beam-current density, beam-aperture angle, and optical-system axial length.

6. A charged-particle-beam (CPB) microlithographic projection-exposure apparatus, comprising:
   (a) a substrate stage on which a sensitive substrate is mounted for CPB projection-exposure of the substrate;
   (b) a reticle stage on which a reticle is mounted, the reticle defining a pattern to be CPB projection-exposed onto the substrate and being divided into multiple exposure units each defining a respective portion of the pattern;
   (c) an illumination-optical system situated upstream of the reticle stage, the illumination-optical system comprising multiple CPB-illumination-optical components and being configured to sequentially illuminate the exposure units of the reticle with a CPB illumination beam;
   (d) a projection-optical system situated between the reticle stage and the substrate stage, the projection-optical system comprising multiple CPB-projection-optical components and being configured to project, via a patterned beam propagating downstream of the reticle on the reticle stage, an image of the illuminated exposure unit onto a corresponding location on the sensitive substrate so as to stitch together the exposure-unit images and form an image of the pattern on the substrate; and
   (e) a controller connected to each of the illumination-optical components and to each of the projection-optical components, the controller being configured to controllably energize each of said components;
   (f) a computer connected to the controller, the computer comprising a memory for storing a look-up table comprising a listing of index data for each of multiple exposure units of the pattern and, for each index datum, corresponding values of imaging parameters pertaining to said components, each index datum being based on a distribution of pattern features within the respective exposure unit, wherein, as an exposure unit is selected for exposure, the index datum for the exposure unit as well as the corresponding values of imaging parameters are recalled from the memory and routed from the computer to the controller, the controller causing energization of said components according to the recalled values of imaging parameters to perform an optical correction of the image of the respective exposure unit as formed on the substrate.

7. In a method for performing charged-particle-beam (CPB) microlithographic projection-exposure including the steps of defining a pattern, to be projection-exposed onto a sensitive substrate, on a divided reticle comprising multiple exposure units each defining a respective portion of the pattern; sequentially illuminating the exposure units with a CPB illumination beam to form a respective CPB patterned beam; and projecting the patterned beam onto a sensitive substrate to form images of the exposure units at respective locations on the substrate at which the images of the exposure units are stitched together to form an image of the pattern on the substrate, a method for performing an imaging correction of an image of an exposure unit as formed on the substrate, comprising:

(a) providing an index datum for the exposure unit based on a respective distribution of pattern features in the exposure unit;

(b) providing respective values of at least one imaging parameter for imaging the exposure unit on the substrate, the values corresponding to the index datum and being appropriate for correcting an image of the exposure unit as formed on the substrate;

(c) for each of various exposure units of the pattern, storing the index data and respective values of the imaging parameters as a look-up table in a memory;

(d) as an exposure unit is selected for exposure, recalling the respective index datum and respective values of the imaging parameters from the look-up table; and (e) exposing the selected exposure unit according to the respective recalled imaging parameters.

8. The method of claim 7, wherein steps (a)–(c) are performed before the reticle is used for performing projection exposure, wherein the look-up table is prepared from pattern data available in advance of exposing the reticle.

9. The method of claim 7, wherein the imaging parameters pertain to at least one of shape astigmatism, imaging astigmatism, focus, rotation, magnification, and position of the image of the exposure unit on the reticle.

10. The method of claim 7, wherein, in step (b), the respective values of the imaging parameters are determined according to optical simulation calculations or actual measurements as standards.

11. The method of claim 10, wherein, in step (b), the respective values of the imaging parameters are determined further according to projection-exposure apparatus variables including one or more of beam-acceleration voltage, beam-current density, beam-aperture angle, and optical-system axial length.

12. In a method for performing charged-particle-beam (CPB) microlithographic projection-exposure including the steps of defining a pattern, to be projection-exposed onto a sensitive substrate, on a divided reticle comprising multiple exposure units each defining a respective portion of the pattern; sequentially illuminating the exposure units with a CPB illumination beam to form a respective CPB patterned beam; and projecting the patterned beam onto a sensitive substrate to form images of the exposure units at respective locations on the substrate at which the images of the exposure units are stitched together to form an image of the pattern on the substrate, a method for performing an imaging correction of an image of an exposure unit as formed on the substrate, comprising:

(a) providing an index datum for the exposure unit based on a respective distribution of pattern features in the exposure unit;

(b) providing respective values of at least one imaging parameter for imaging the exposure unit on the substrate, the values corresponding to the index datum and being appropriate for correcting an image of the exposure unit as formed on the substrate;

(c) for each of various exposure units of the pattern, storing the index data and respective values of the imaging parameters as a look-up table in a memory of a computer, and routing exposure data, as required for each exposure unit, from the computer to a controller, the exposure data including imaging parameters for exposure of the respective exposure unit;

(d) as an exposure unit is selected for exposure, receiving the respective values of the imaging parameters from the controller; and (e) exposing the selected exposure unit according to the respective recalled imaging parameters.

13. In a method for performing charged-particle-beam (CPB) microlithographic projection-exposure including the steps of defining a pattern, to be projection-exposed onto a sensitive substrate, on a divided reticle comprising multiple exposure units each defining a respective portion of the pattern; sequentially illuminating the exposure units with a CPB illumination beam to form a respective CPB patterned beam; and projecting the patterned beam onto a sensitive substrate to form images of the exposure units at respective locations on the substrate at which the images of the exposure units are stitched together to form an image of the pattern on the substrate, a method for performing an imaging correction of an image of an exposure unit as formed on the substrate, comprising:

(a) providing an index datum for the exposure unit based on a respective distribution of pattern features in the exposure unit;

(b) determining a respective value of at least one imaging parameter for imaging the exposure unit on the substrate, each such value corresponding to the index datum and being appropriate for correcting an image of the exposure unit as formed on the substrate; and (c) exposing the selected exposure unit according to the at least one respective determined imaging parameter.

14. The method of claim 13, performed before the reticle is used for performing projection exposure, wherein the index datum and the respective value of at least one imaging parameter are prepared from pattern data available in advance of exposing the reticle.

15. The method of claim 13, wherein the imaging parameter pertains to at least one of shape astigmatism, imaging astigmatism, focus, rotation, magnification, and position of the image of the exposure unit on the reticle.

16. The method of claim 13, wherein the respective value of at least one imaging parameter is determined according to optical simulation calculations or actual measurements as standards.

17. The method of claim 16, wherein the respective value of at least one imaging parameter is determined further according to projection-exposure apparatus variables including one or more of beam-acceleration voltage, beam-current density, beam-aperture angle, and optical-system axial length.

18. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; developing the resist; and (iv) annealing the resist; and step (ii) comprises providing a charged-particle-beam projection-exposure apparatus as recited in claim 1; and using the charged-particle-beam projection-exposure apparatus to expose the resist with the pattern defined on the reticle.

19. A semiconductor device produced by the method of claim 18.

20. A semiconductor-fabrication process, comprising the steps of:

(a) preparing a wafer;

(b) processing the wafer; and (c) assembling devices formed on the wafer during steps (a) and (b), wherein step (b) comprises the steps of (i)

applying a resist to the wafer; (ii) exposing the resist; developing the resist; and (iv) annealing the resist; and step (ii) comprises providing a charged-particle-beam projection-exposure apparatus as recited in claim 6; and using the charged-particle-beam projection-exposure apparatus to expose the resist with the pattern defined on the reticle.

21. A semiconductor device produced by the method of claim 20.

22. A semiconductor-fabrication process, comprising the steps of:

(a) preparing a wafer;

(b) processing the wafer; and (c) assembling devices formed on the wafer during steps (a) and (b), wherein step (b) comprises a method for performing projection microlithography as recited in claim 7.

23. A semiconductor-fabrication process, comprising the steps of:

(a) preparing a wafer;

(b) processing the wafer; and (c) assembling devices formed on the wafer during steps (a) and (b), wherein step (b) comprises a method for performing projection microlithography as recited in claim 12.

24. A semiconductor-fabrication process, comprising the steps of:

(a) preparing a wafer;

(b) processing the wafer; and (c) assembling devices formed on the wafer during steps (a) and (b), wherein step (b) comprises a method for performing projection microlithography as recited in claim 13.

* * * * *

UNITED STATES PATENT AND TRADEMARK OFFICE
CERTIFICATE OF CORRECTION

PATENT NO. : 6,151,101
DATED : November 21, 2000
INVENTOR(S) : Teruaki Okino

It is certified that error appears in the above-identified patent and that said Letters Patent is hereby corrected as shown below:

Column 2,
Line 4, "projectionoptical" should read -- projection-optical --.
Line 67, "nonuniform" should read -- non-uniform --.

Column 4,
Line 3, "CPB1 illumination-optical" should read -- CPB-illumination-optical --.
Line 32, "lookup" should read -- look-up --.

Column 8,
Line 13, "etc.)." should read -- etc. --.

Column 9,
Line 15, "pm" should read -- µm --.

Column 11,
Line 28, "CPBillumination" should read -- CPB-illumination --.

Signed and Sealed this

Seventh Day of May, 2002

*Attest:*

JAMES E. ROGAN
*Attesting Officer*     *Director of the United States Patent and Trademark Office*